(12) United States Patent
Hsu et al.

(10) Patent No.: US 12,527,080 B2
(45) Date of Patent: Jan. 13, 2026

(54) INTEGRATED HIGH, MEDIUM, AND LOW VOLTAGE SEMICONDUCTOR DEVICES AND METHOD FOR FABRICATING THE SAME

(71) Applicant: UNITED MICROELECTRONICS CORP., Hsin-Chu (TW)

(72) Inventors: Chih-Kai Hsu, Tainan (TW); Yu-Hsiang Lin, New Taipei (TW); Zen-Jay Tsai, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 407 days.

(21) Appl. No.: 18/107,983

(22) Filed: Feb. 9, 2023

(65) Prior Publication Data
US 2024/0213247 A1  Jun. 27, 2024

(30) Foreign Application Priority Data
Dec. 23, 2022 (CN) .......................... 202211663459.0

(51) Int. Cl.
*H10D 84/85* (2025.01)
*H10D 84/01* (2025.01)
*H10D 84/03* (2025.01)

(52) U.S. Cl.
CPC ......... *H10D 84/856* (2025.01); *H10D 84/017* (2025.01); *H10D 84/0181* (2025.01); *H10D 84/0188* (2025.01); *H10D 84/0193* (2025.01); *H10D 84/038* (2025.01); *H10D 84/853* (2025.01)

(58) Field of Classification Search
CPC .............. H10D 84/853; H10D 84/856; H10D 84/0801; H10D 84/0188
See application file for complete search history.

(56) References Cited

U.S. PATENT DOCUMENTS

| 7,755,162 B2 | 7/2010 | Kurjanowicz et al. | |
|---|---|---|---|
| 2003/0022435 A1* | 1/2003 | Chen ................... | H10D 84/0144 257/E21.285 |
| 2013/0234244 A1* | 9/2013 | Liu ....................... | H10D 64/514 257/334 |
| 2020/0212200 A1* | 7/2020 | Ghani ................... | H10D 89/10 |
| 2023/0154922 A1* | 5/2023 | Yang ................... | H10D 84/834 257/369 |
| 2023/0197725 A1* | 6/2023 | Weng ................... | H01L 21/761 |

OTHER PUBLICATIONS

Hsu, the specification, including the claims, and drawings in the U.S. Appl. No. 17/586,699, filed Jan. 27, 2022.

* cited by examiner

*Primary Examiner* — Davienne N Monbleau
*Assistant Examiner* — Emily Farmer
(74) *Attorney, Agent, or Firm* — Winston Hsu

(57) ABSTRACT

A method for fabricating a semiconductor device includes providing a substrate having a first region and a second region, forming a first gate dielectric layer on the first region, forming a second gate dielectric layer on the second region, and forming a first gate structure on the first gate dielectric layer and the second gate dielectric layer. Preferably, the first gate dielectric layer and the second gate dielectric layer have different thicknesses.

14 Claims, 15 Drawing Sheets

US 12,527,080 B2

INTEGRATED HIGH, MEDIUM, AND LOW VOLTAGE SEMICONDUCTOR DEVICES AND METHOD FOR FABRICATING THE SAME

BACKGROUND OF THE INVENTION

1. Field of the Invention

The invention relates to a method of fabricating semiconductor device, and more particularly to a method of integrating high-voltage (HV) device, medium-voltage (MV) device, and low-voltage (LV) device.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of high-voltage devices and FinFET devices start to face numerous challenges such as current leakage and control of breakdown voltage. Hence, how to improve the current fabrication for improving performance of the device has become an important task in this field.

SUMMARY OF THE INVENTION

According to an embodiment of the present invention, a method for fabricating a semiconductor device includes providing a substrate having a first region and a second region, forming a first gate dielectric layer on the first region, forming a second gate dielectric layer on the second region, and forming a first gate structure on the first gate dielectric layer and the second gate dielectric layer. Preferably, the first gate dielectric layer and the second gate dielectric layer have different thicknesses.

According to another aspect of the present invention, a semiconductor device includes a substrate having a first region and a second region, a first gate dielectric layer on the first region, a second gate dielectric layer on the second region, and a first gate structure on the first gate dielectric layer and the second gate dielectric layer. Preferably, the first gate dielectric layer and the second gate dielectric layer have different thicknesses.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
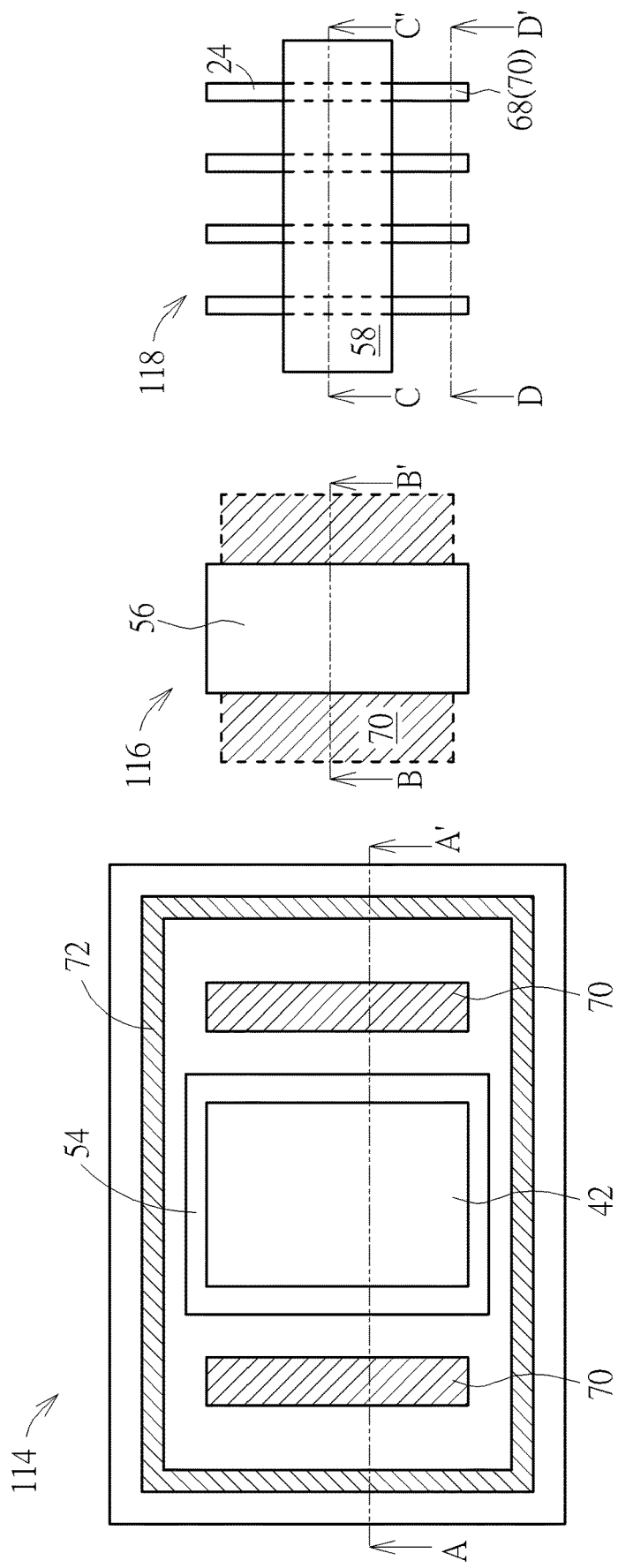
FIGS. 1-11 illustrate a method for fabricating a semiconductor device according to an embodiment of the present invention.
Figure 2:
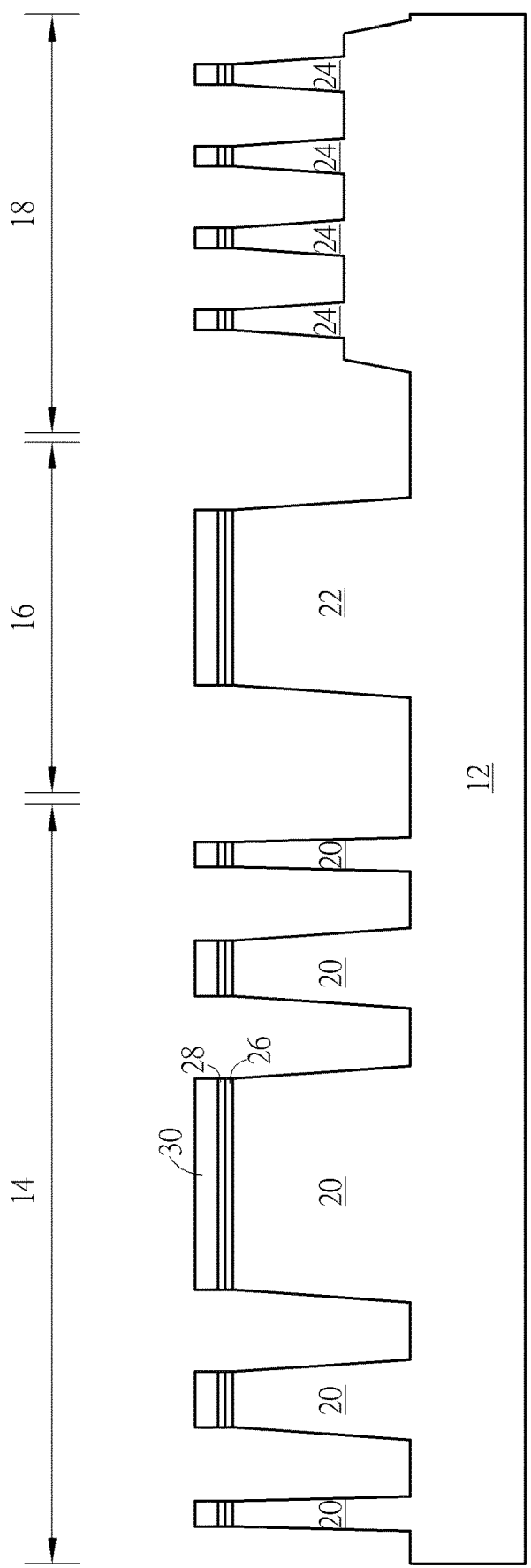

Referring to FIGS. 1-11, FIGS. 1-11 illustrate a method for fabricating a semiconductor device according to an embodiment of the present invention, in which FIG. 1 illustrates a top view for fabricating the semiconductor device according to an embodiment of the present invention and FIGS. 2-11 illustrate cross-section views for fabricating the semiconductor device along the sectional lines AA', BB', and CC'. As shown in FIGS. 1-2, a substrate 12 such as a silicon substrate or silicon-on-insulator (SOI) substrate is provided and three or more transistor regions including a high voltage (HV) region 14, a medium-voltage (MV) region 16, and a low-voltage (LV) region 18 are defined on the substrate 12, in which at least a HV device 114 is disposed on the HV region 14, a MV device 116 is disposed on the MV region 16, the LV region 18 could further include a core region and/or an input/output (I/O) region, and a LV device 118 is disposed on the LV region 18. Preferably, FIGS. 2-11 are cross-section views illustrating a method for fabricating the semiconductor device taken along the sectional line AA' of the HV region 14, the sectional line BB' of the MV region 16, and the sectional line CC' of the LV region 18.

In this embodiment, the three regions 14, 16, 18 could be transistor regions having same conductive type or different conductive types. For instance, each of the three regions 14, 16, 18 could be a PMOS region or a NMOS region and the three regions 14, 16, 18 are defined to fabricate gate structures having different threshold voltages in the later process. Preferably, it would be desirable to first conduct an implantation process to form p-type deep wells on the HV region 14 and MV region 16 and a n-type deep well on the LV region 18, but not limited thereto.

Next, bases 20, 22 are formed on the HV region 14 and MV region 16 and a plurality of fin-shaped structures 24 are formed on the substrate 12 of the LV region 18. Preferably, the bases 20, 22 and the fin-shaped structures 24 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the bases 20, 22 and the fin-shaped structures 24 could also be obtained by first forming a patterned mask (not shown) on the substrate, 12, and through an etching process, the pattern of the patterned mask is transferred to the substrate 12 to form the bases 20, 22 and the fin-shaped structures 24. Moreover, the formation of the bases 20, 22 and the fin-shaped structures 24 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding the bases 20, 22 and fin-shaped structures 24. These approaches for forming the bases 20, 22 and fin-shaped structures 24 are all within the scope of the present invention.

In this embodiment, a liner 26, a liner 28, and a hard mask 30 could be formed on each of the bases 20, 22 and the fin-shaped structures 24 during the aforementioned patterning process, in which the liner 26 preferably includes silicon oxide (SiO$_2$), the liner 28 includes silicon nitride (SiN), and the hard mask 30 includes silicon oxide (SiO$_2$), but not limited thereto.

Figure 3:
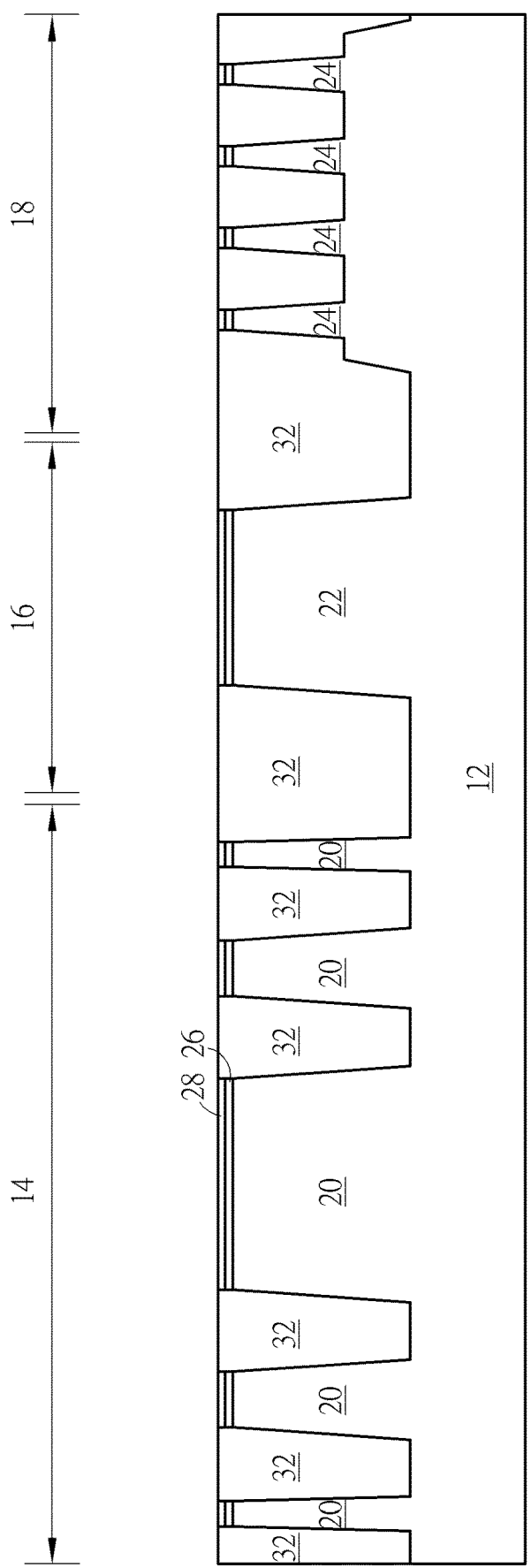

Next, as shown in FIG. 3, a flowable chemical vapor deposition (FCVD) process is conducted to form an insulating layer 32 made of silicon oxide on the bases 20, 22 and the fin-shaped structures 24 and filling the trenches between the bases 20, 22 and the fin-shaped structures 24, and a planarizing process such as chemical mechanical polishing (CMP) process is conducted to remove the hard mask 30 so that the top surfaces of the liner 28 and the insulating layer 32 are coplanar.

Figure 4:
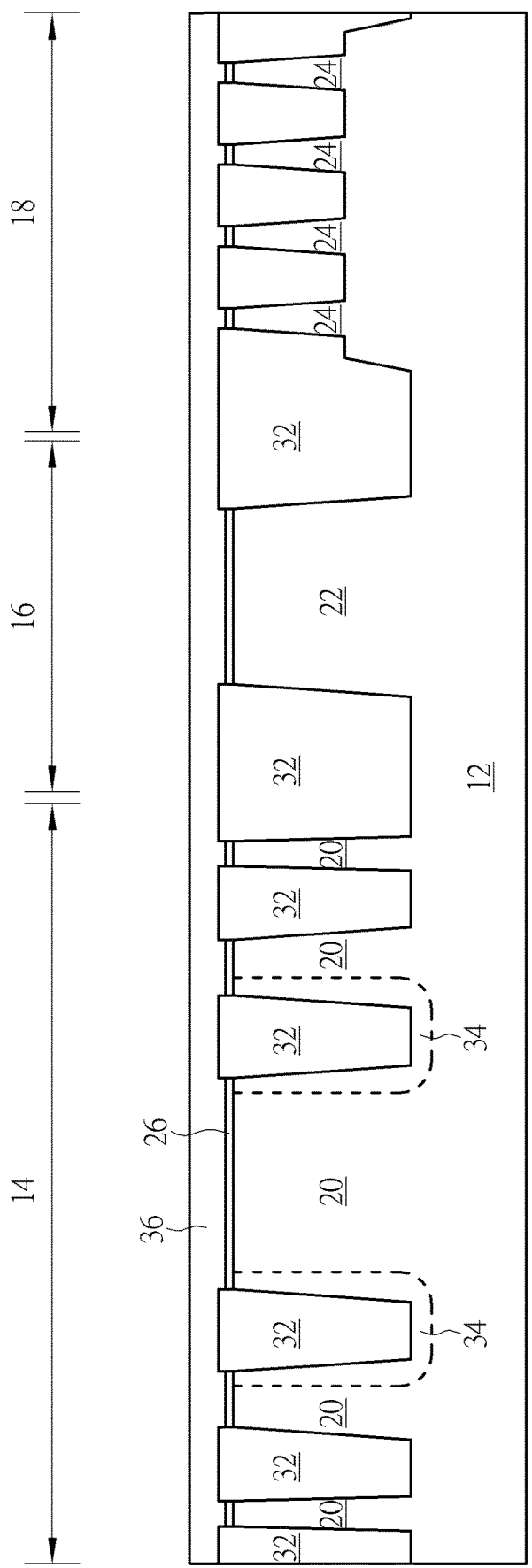

Next, as shown in FIG. 4, the liner 28 made of silicon oxide is removed through etching process to expose the liner 26 made of silicon nitride underneath. As a result, the top surface of the insulating layer 32 becomes slightly higher than the top surface of the liner 26 and at the same time forming recesses (not shown) directly above the liner 26. Next, an ion implantation process is conducted to form doped regions 34 in the base 20 on the HV region 14, in which the doped regions 34 preferably serve as lightly doped drains (LDDs) for the HV device 114 formed afterwards. Next, a hard mask 36 is formed on the bases 20, 22 and fin-shaped structures 24 on the HV region 14, the MV region 16, and the LV region 18 and filling the recesses above the liner 26. In this embodiment, the hard mask 36 is preferably made of SiN, but not limited thereto.

Figure 5:
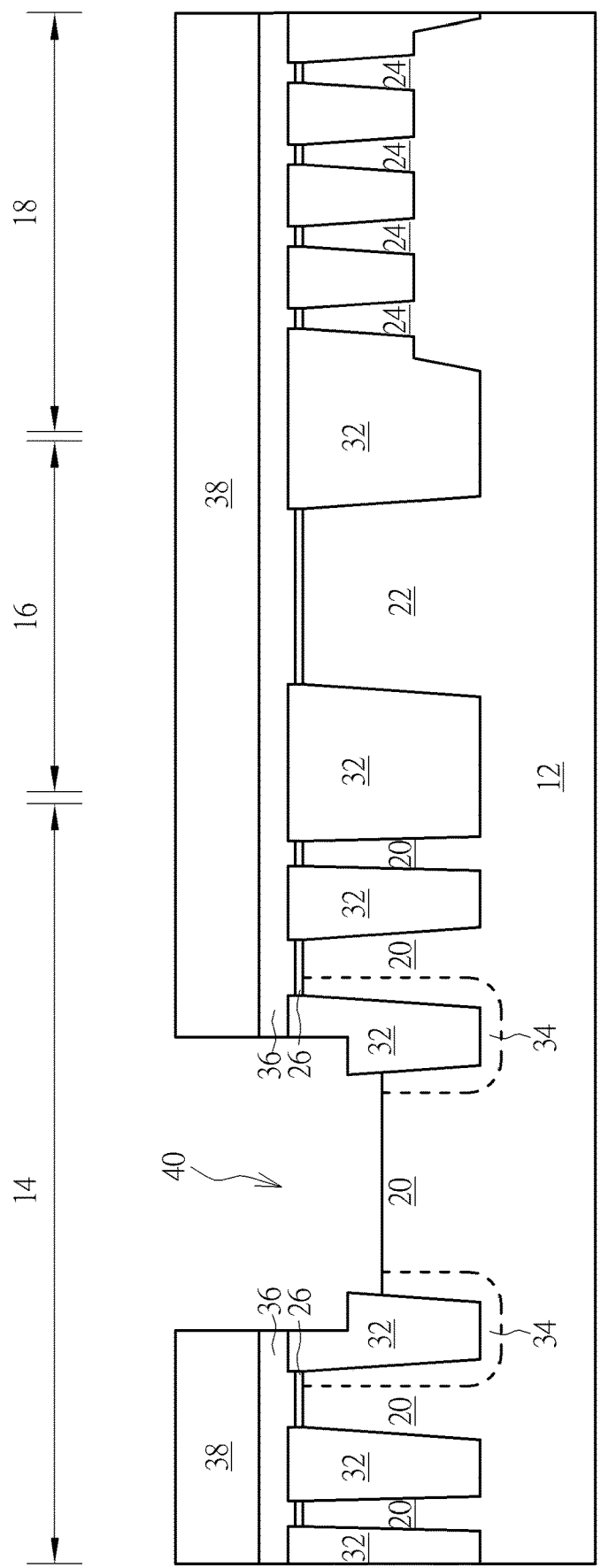

Next, as shown in FIG. 5, a patterned mask 38 such as a patterned resist is formed on the hard mask 36 on the MV region 16 and the LV region 18 as the patterned mask 38 includes an opening exposing the surface of the hard mask 36 on the HV region 14. Next, an etching process is conducted by using the patterned mask 38 as mask to remove part of the hard mask 36, part of the base 20, and part of the insulating layer 32 adjacent to two sides of the base 20 for forming a trench 40.

Figure 6:
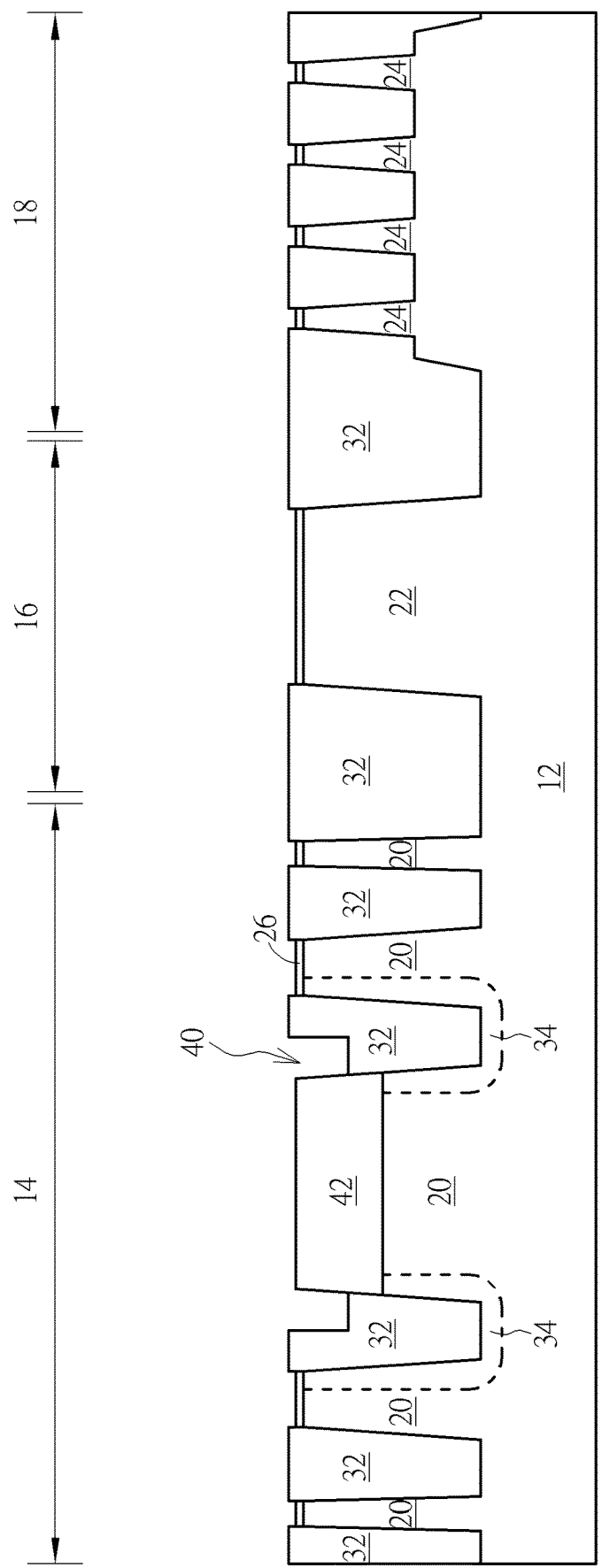

Next, after removing the patterned mask 38 as shown in FIG. 6, an oxide growth process or more specifically a rapid thermal oxidation (RTO) process is conducted to form a gate dielectric layer 42 made of silicon oxide on the base 20 on the HV region 14, and the hard mask 36 is completely removed thereafter. Preferably, the remaining trench 40 formed by the patterned mask 38 is adjacent to two sides of the gate dielectric layer 42 and the top surface of the gate dielectric layer 42 is even with the top surface of the insulating layer 32 on both MV region 16 and LV region 18.

Next, another patterned mask (not shown) such as a patterned resist could be formed to cover the insulating layer 32 on the HV region 14 and MV region 16 as the patterned mask includes an opening exposing the top surface of the liner 26 and insulating layer 32 on the LV region 18, and then an ion implantation process is conducted to implant dopants into the fin-shaped structures 24 on the LV region 18 for adjusting threshold voltage (Vt) of the device. The patterned mask is then removed thereafter.

Figure 7:
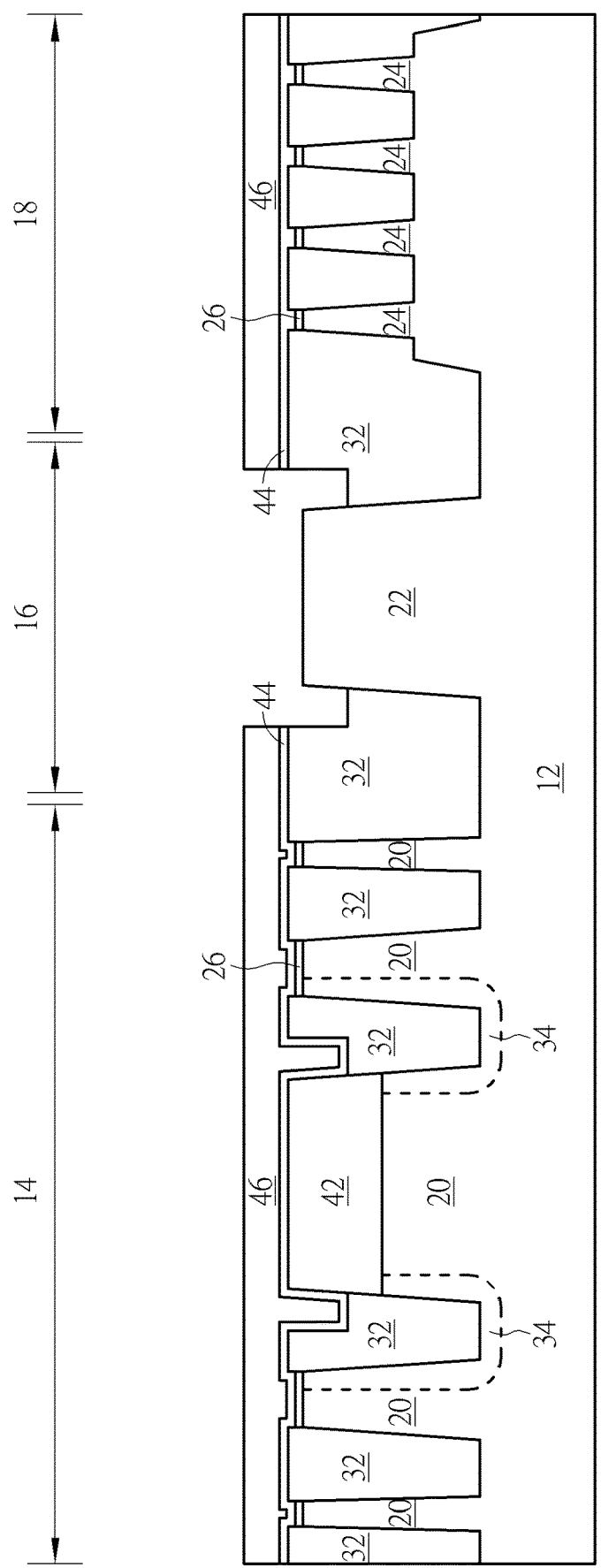

Next, as shown in FIG. 7, a hard mask 44 made of SiN is formed on the HV region 14, the MV region 16, and the LV region 18 including the gate dielectric layer 42 on the HV region 14, the base 24 on the MV region 16, and the fin-shaped structures 24 on the LV region 18, and then another patterned mask 46 such as a patterned resist is formed on the insulating layer 32 on the HV region 14 and LV region 18, in which the patterned mask 46 includes an opening exposing the hard mask 44 on the MV region 16. Next, an etching process is conducted by using the patterned mask 46 as mask to remove the hard mask 44, part of the insulating layer 32, the liner 26, and even part of the base 22 on the MV region 16 for exposing the surface of the base 22.

Figure 8:
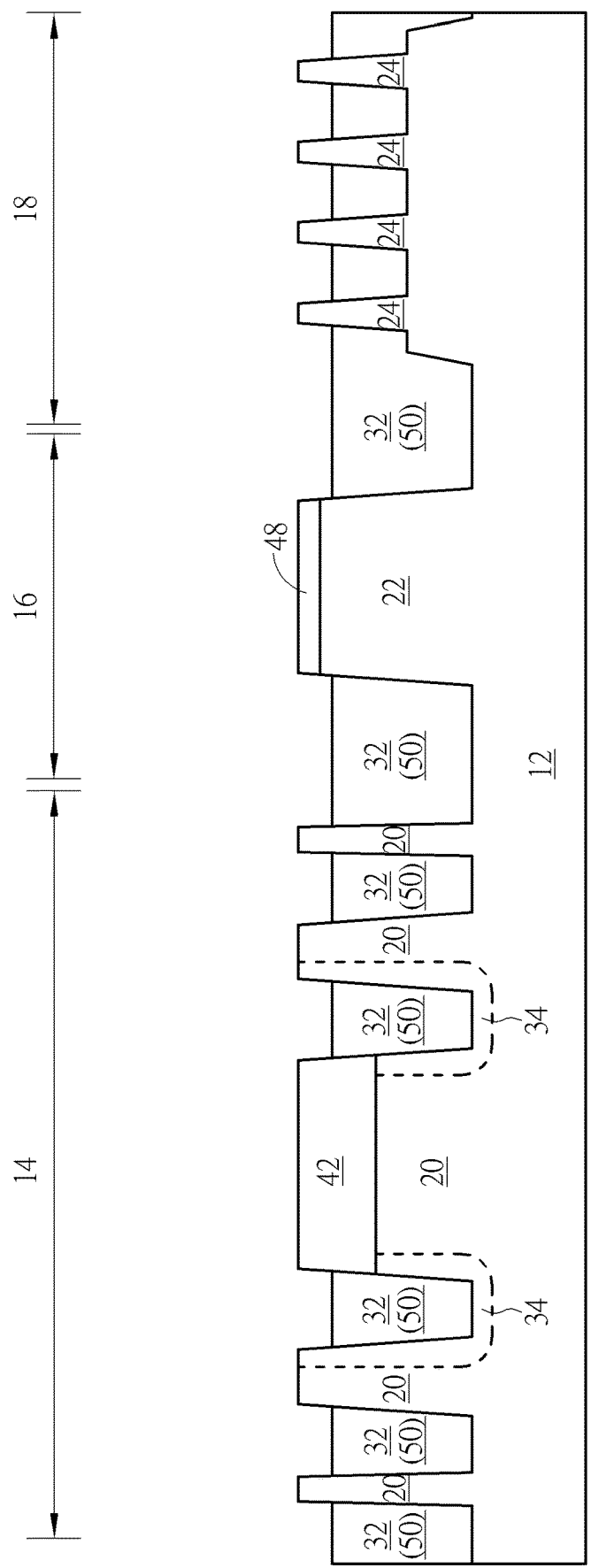

Next, as shown in FIG. 8, another oxide growth process such as a RTO process is conducted to form a gate dielectric layer 48 made of silicon oxide on the base 22 on MV region 16, in which the top surface of the gate dielectric layer 48 on the MV region 16 is higher than the top surface of the gate dielectric layer 42 on the HV region 14 while the thickness of the gate dielectric layer 42 on the HV region 14 is greater than the thickness of the gate dielectric layer 48 on the MV region 16. In this embodiment, the thickness of the gate dielectric layer 42 on the HV region 14 could be more than one time such as 1.5 times or even two times the thickness of the gate dielectric layer 48 on the MV region 16.

Next, the patterned mask 46 and remaining hard mask 44 on the HV region 14, MV region 16, and LV region 18 are removed, and an etching process is conducted to completely remove the liner 26 on the fin-shaped structures 24 on the LV region 14 for exposing the top surface of the fin-shaped structures 24 and also remove part of the insulating layer 32 on the HV region 14, MV region 16, and LV region 18 so that the top surface of the insulating layer 32 is slightly lower than the top surface of the bases 20, 22 and the fin-shaped structures 24 for forming a shallow trench isolation (STI) 50. It should be noted that at this stage, the top surface of the gate dielectric layer 42 on the HV region 14 is substantially even with the top surface of the gate dielectric layer 48 on the MV region 16 and the top surface of the fin-shaped structures 24 on the LV region 18.

Figure 9:
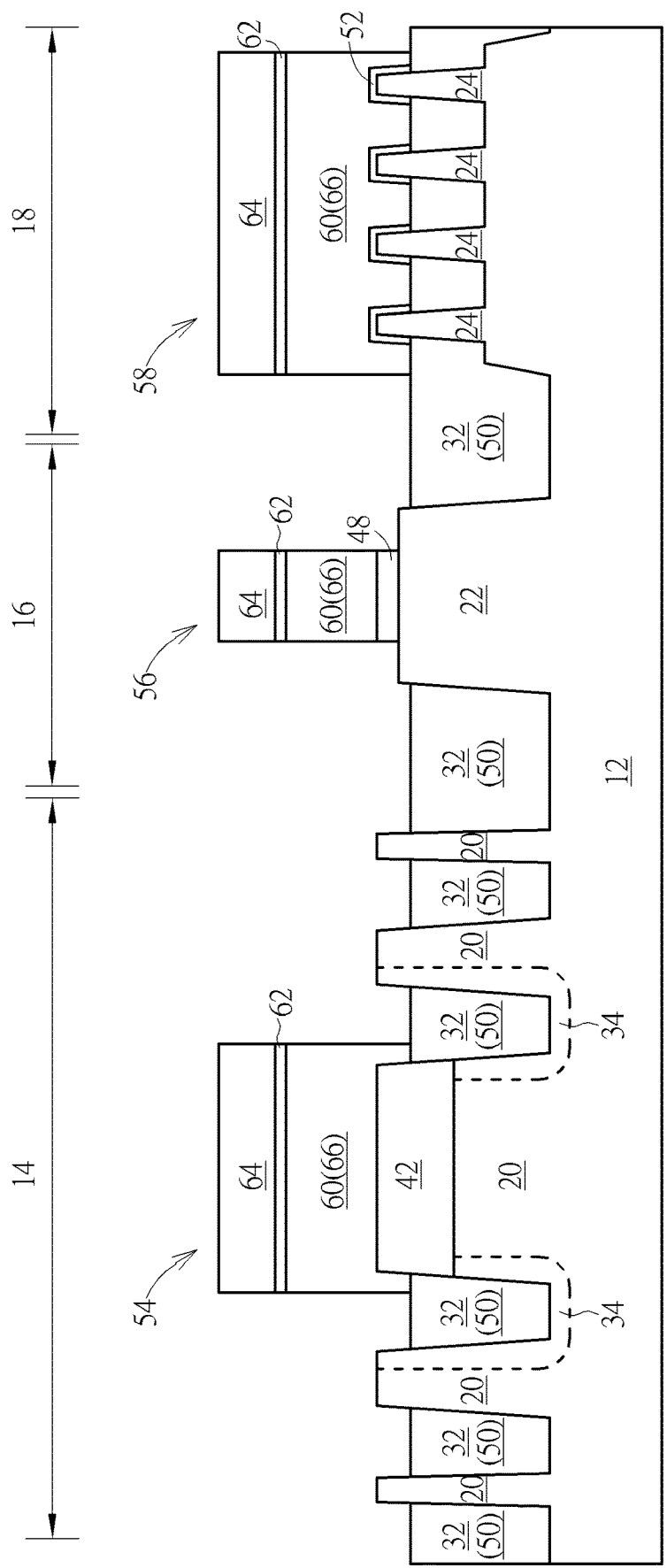

Next, as shown in FIG. 9, an oxidation process such as an in-situ steam generation (ISSG) process is conducted to form a gate dielectric layer 52 on the surface of fin-shaped structures 24 on the LV region 18. Next, gate structures 54, 56, 58 or dummy gates could be formed on the bases 20, 22 and the fin-shaped structures 24 on the HV region 14, MV region 16, and LV region 18. In this embodiment, the formation of the gate structures 54, 56, 58 could be accomplished by a gate first process, a high-k first approach from gate last process, or a high-k last approach from gate last process. Since this embodiment pertains to a high-k last approach, a gate material layer 60 preferably made of polysilicon, a hard mask 62 made of SiN, and a hard mask 64 made of silicon oxide could be formed sequentially on the gate dielectric layers 42, 48, 52, and a pattern transfer process is then conducted by using a patterned resist (not shown) as mask to remove part of the hard masks 62, 64 and part of the gate material layer 60 through single or multiple etching processes. After stripping the patterned resist, gate structures 54, 56, 58 composed of gate dielectric layers 42, 48, 52 respectively and patterned gate material layers 60 are formed on the substrate 12 on each region, in which the patterned gate material layer 60 becomes a gate electrode 66 on each region.

Next, at least a spacer (not shown) is formed on sidewalls of the gate structures 54, 56, 58. In this embodiment, the spacer could be a single spacer or a composite spacer, in which the spacer could further include an offset spacer (not shown) and a main spacer (not shown). The offset spacer and the main spacer are preferably made of different materials while the offset spacer and main spacer could all be selected from the group consisting of $SiO_2$, SiN, SiON, and SiCN, but not limited thereto.

Figure 10:
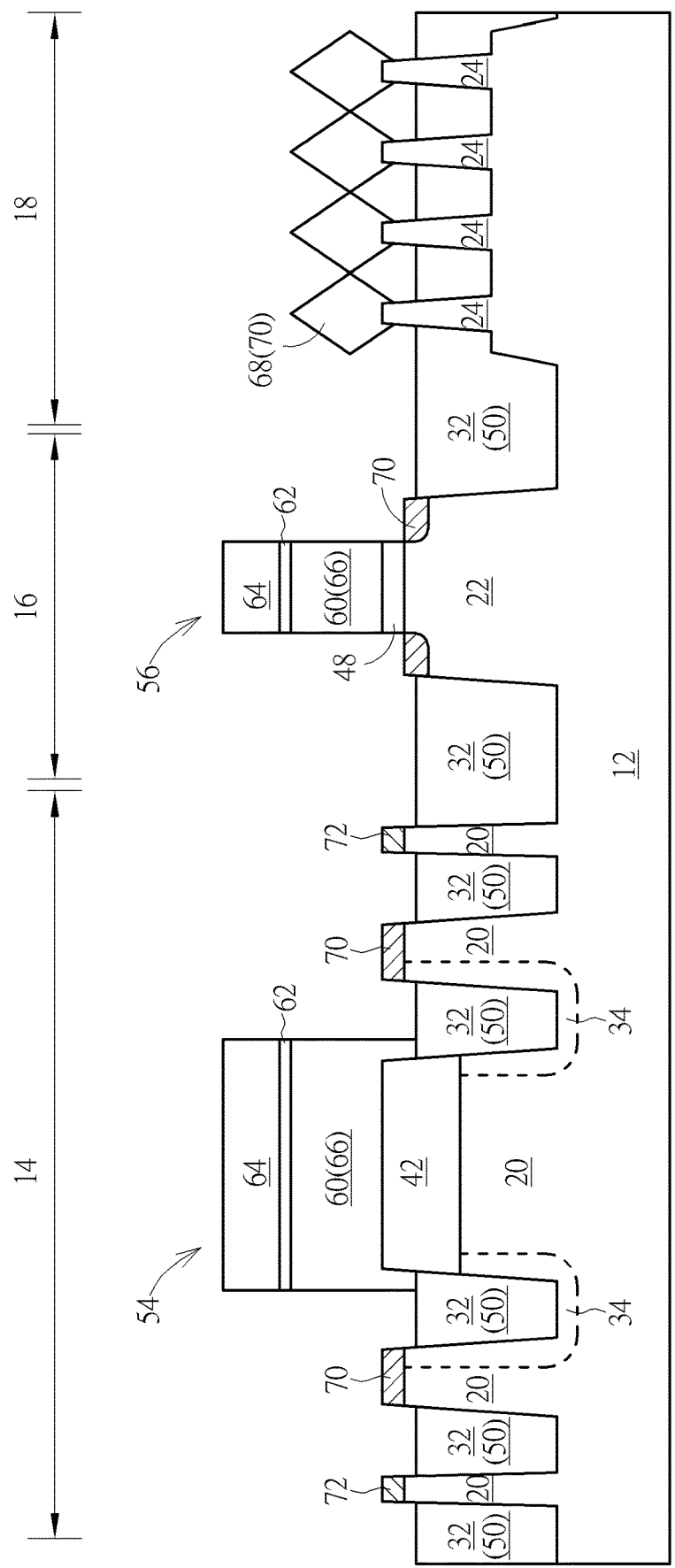

Referring to FIG. 10, FIG. 10 illustrates a method for fabricating a semiconductor device according to an embodiment of the present invention taken along the sectional line AA' of the HV region 14, the sectional line BB' of the MV region 16, and the sectional line DD' of the LV region 18. As shown in FIG. 10, one or more dry etching and/or wet etching process could be conducted by using the gate structure 58 and spacer on the LV region 18 as mask to remove part of the substrate 12 for forming recesses (not shown) adjacent to two sides of the gate structure 58. Next, a selective epitaxial growth (SEG) process is conducted to form epitaxial layers 68 in the recesses. Preferably, epitaxial layers 68 are only formed adjacent to two sides of the gate structure 58 on the LV region 18 while no epitaxial layers are formed on the HV region 14 and the MV region 16.

As shown in the cross-section view of FIG. 10, the epitaxial layers 68 on the LV region 18 also share substantially same cross-section shape with the recesses. For instance, the cross-section of each of the epitaxial layers 68 could also include a circle, a hexagon, or an octagon depending on the demand of the product. In this embodiment, the epitaxial layers 68 could also be formed to include different materials depending on the type of transistor being fabricated. For instance, if the MOS transistor being fabricated were to be a PMOS transistor, the epitaxial layers 68 could be made of material including but not limited to for example SiGe, SiGeB, or SiGeSn. If the MOS transistor being fabricated were to be a NMOS transistor, the epitaxial layers 68 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 68 is preferred to have less or no germanium atom at all to facilitate the formation of silicide afterwards.

Next, a photo-etching process could be conducted to remove part of the gate dielectric layer 48 on the MV region 16 for exposing the surface of the base 22 adjacent to two sides of the gate structure 56, and then one or more ion implantation process is conducted to form source/drain regions 70 in the bases 20, 22 adjacent to two sides of the gate structures 54, 56 on the HV region 14 and MV region 16 and at the same time form doped regions serving as an electrostatic discharge (ESD) protection ring 72 in the base 20 around the HV device 114 on the HV region 14. Preferably, the source/drain regions 70 and the ESD protection ring 72 on the HV region 14 include dopants of different conductive type. For instance, either one of the source/drain regions 70 and the ESD protection ring 72 could include n-type dopants while the other include p-type dopants.

According to an embodiment of the present invention, it would also be desirable to form source/drain regions 70 in part or all of the epitaxial layers 68 on the LV region 18. According to another embodiment of the present invention, the source/drain regions 70 could also be formed insituly during the SEG process. For instance, the source/drain regions 70 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain regions 70. Moreover, the dopants within the source/drain regions 70 could also be formed with a gradient, which is also within the scope of the present invention.

Figure 11:
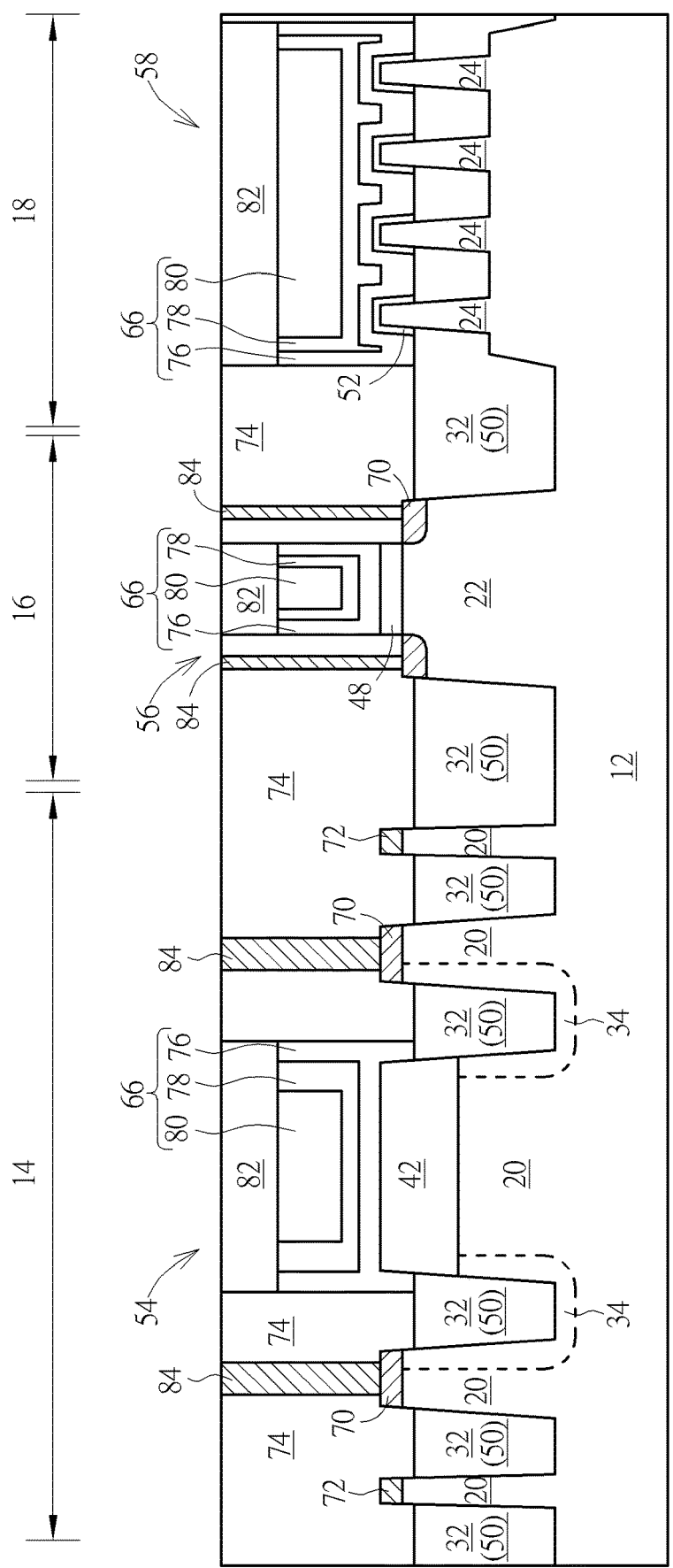

Next, as shown in FIG. 11, a selective contact etch stop layer (CESL) (not shown) could be formed on the substrate 12 surface to cover the gate structures 54, 56, 58 on the HV region 14, MV region 16, and LV region 18, and an interlayer dielectric (ILD) layer 74 is formed on the CESL afterwards. Next, a planarizing process such as a chemical mechanical polishing (CMP) process is conducted to remove part of the ILD layer 74 and part of the CESL so that the top surfaces of the hard mask 64 and ILD layer 74 are coplanar.

Next, a replacement metal gate (RMG) process is conducted to transform the gate structures 54, 56, 58 on the HV region 14, MV region 16, and LV region 18 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard masks 62, 64 and the gate material layers 60 from gate structures 54, 56, 58 for forming recesses (not shown) in the ILD layer 74. Next, a high-k dielectric layer 76, a work function metal layer 78, and a low resistance metal layer 80 are formed in the recesses, and a planarizing process such as CMP is conducted to remove part of low resistance metal layer 80, part of work function metal layer 78, and part of high-k dielectric layer 76 to form metal gates. Preferably, the high-k dielectric layer 76, the work function metal layer 78, and the low resistance metal layer 80 altogether constitute the gate electrode 66 of each of the transistors or devices.

In this embodiment, the high-k dielectric layer 76 is preferably selected from dielectric materials having dielectric constant (k value) larger than 4. For instance, the high-k dielectric layer 46 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 78 is formed for tuning the work function of the metal gate in accordance with the conductivity of the device. For an NMOS transistor, the work function metal layer 78 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 78 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 78 and the low resistance metal layer 50 may include titanium (Ti), titanium nitride (TiN), tantalum (Ta) or tantalum nitride (TaN). Furthermore, the material of the low-resistance metal layer 80 may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity. Next, part of the high-k dielectric layer 76, part of the work function metal layer 78, and part of the low resistance metal layer 80 are removed to form recesses (not shown), and a hard mask 82 is formed into each of the recesses so that the top surfaces of the hard masks 82 and the ILD layer 74 are coplanar. Preferably the hard masks 82 could include SiO$_2$, SiN, SiON, SiCN, or combination thereof.

Next, a photo-etching process is conducted by using a patterned mask (not shown) as mask to remove part of the ILD layer 74 and part of the CESL adjacent to the gate structures 54, 56, 58 for forming contact holes (not shown) exposing the source/drain regions 70 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 84 electrically connecting the source/drain regions 70. This completes the fabrication of a semiconductor device according to an embodiment of the present invention.

Referring again to FIGS. 1 and 11, FIGS. 1 and 11 illustrate structural views of a semiconductor device according to an embodiment of the present invention. As shown in FIGS. 1 and 11, the semiconductor device includes a substrate having a HV region 14, a MV region 16, and a LV region 18, a HV device 114 disposed on the HV region 14, a MV device 116 disposed on the MV region 16, and a LV device 118 disposed on the LV region 18, an ESD protection ring 72 surrounding the HV device 114, and a STI 50 around the HV device 114, MV device 116, and LV device 118.

Preferably, the HV device 114 includes a base 20 disposed on the substrate 12, a gate dielectric layer 42 disposed on the base 20, a gate electrode 66 made of high-k dielectric layer 76, work function metal layer 78, and low resistance metal layer 80 disposed on the gate dielectric layer 42, and source/drain regions 70 disposed in the base 20 adjacent to two sides of the gate electrode 66.

The MV device 116 includes a base 22 disposed on the substrate 12, a gate dielectric layer 48 disposed on the base 22, a gate electrode 66 made of high-k dielectric layer 76, work function metal layer 78, and low resistance metal layer 80 disposed on the gate dielectric layer 48, and source/drain regions 70 disposed in the base 22 adjacent to two sides of the gate electrode 66. The LV device 118 includes a plurality of fin-shaped structures 24 disposed on the substrate 12, a gate dielectric layer 52 disposed on the fin-shaped structures 24, a gate electrode 66 made of high-k dielectric layer 76, work function metal layer 78, and low resistance metal layer 80 disposed on the gate dielectric layer 52, and source/drain regions 70 disposed in the fin-shaped structures 24 adjacent to two sides of the gate electrode 66.

Viewing from a more detailed perspective, the top surface of the gate electrode 66 on the HV region 14 is even with the top surface of the gate electrodes 66 on the MV region 16 and LV region 18, the top surface of the gate dielectric layer 42 on HV region 14 is lower than the top surface of the gate dielectric layer 48 on the MV region 16 and the top surface of the fin-shaped structures 24 on the LV region 18 but even within the top surface of the STI 50, the top surface of the gate dielectric layer 48 on the MV region 16 is even with the top surface of the fin-shaped structures 24 on the LV region 18, the top surface of the gate dielectric layer 52 on the LV region 18 could be slightly higher than the top surface of the gate dielectric layer 48 on the MV region 16, the top surface of the source/drain region 70 on the HV region 14 is even with the top surface of the fin-shaped structures 24 on the LV region, and the top surface of the ESD protection ring 72 is even with the top surfaces of the source/drain region 70 on the HV region 14.

Figure 12:
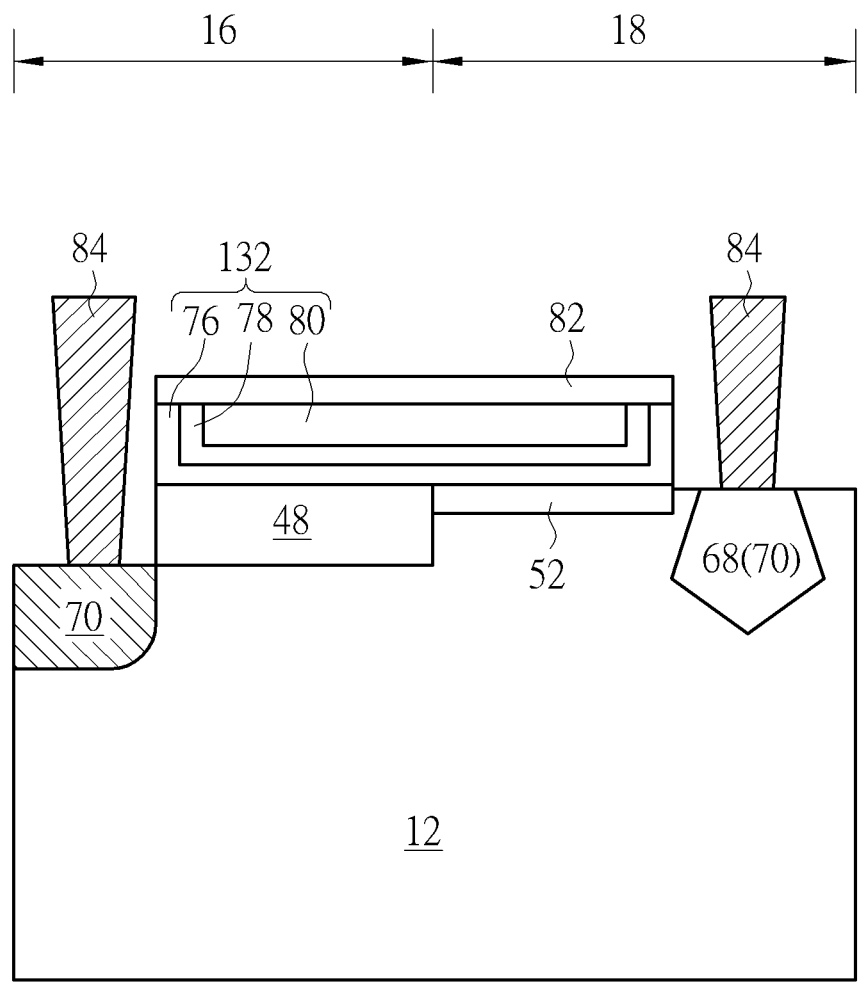
FIG. 12 illustrates a structural view of a boundary device on the boundary between MV region and LV region (or I/O region) according to an embodiment of the present invention.
Figure 13:
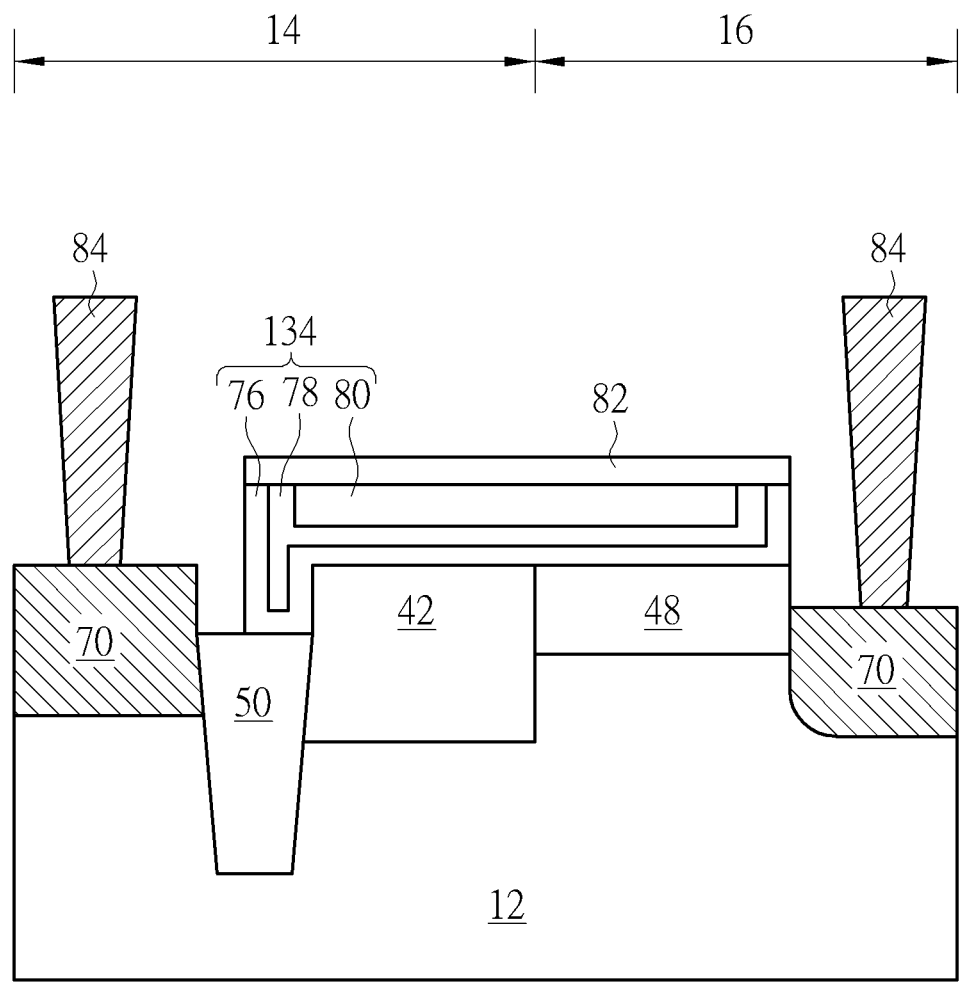
FIG. 13 illustrates a structural view of a boundary device on the boundary between HV region and MV region according to an embodiment of the present invention.
Figure 14:
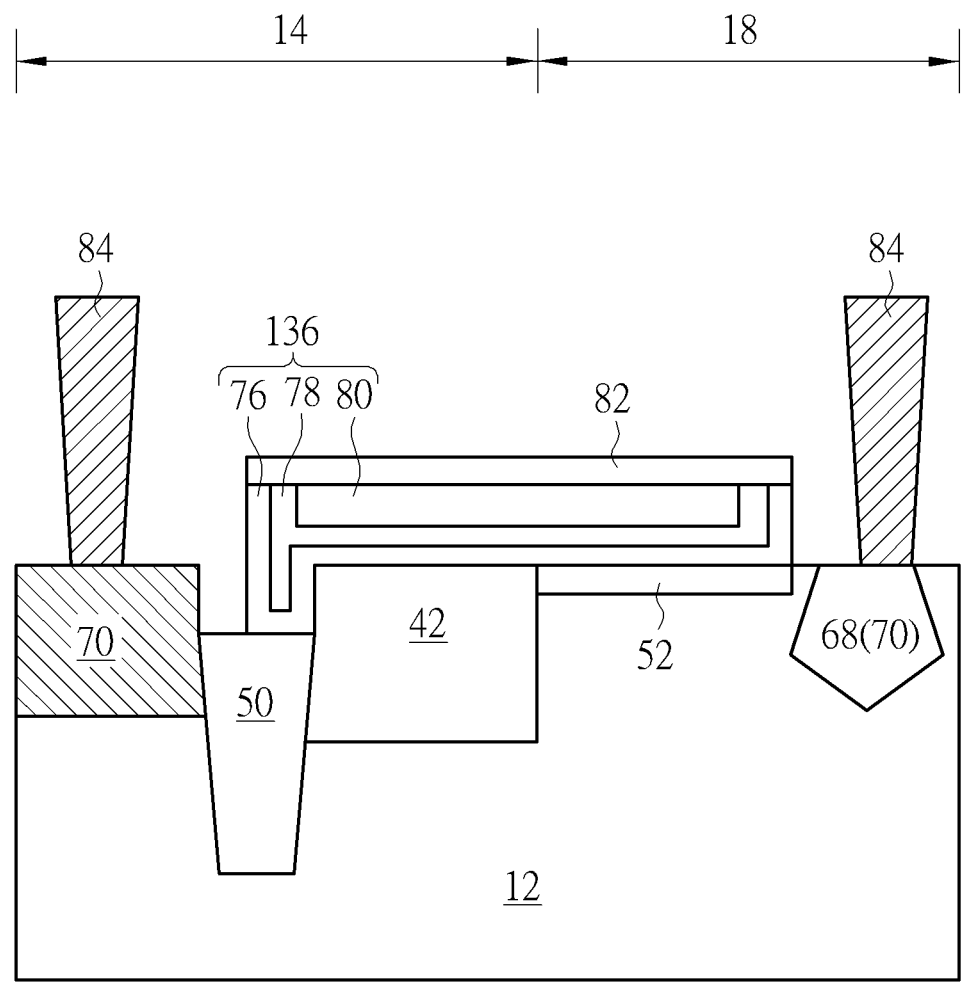
FIG. 14 illustrates a structural view of a boundary device on the boundary between HV region and LV region (or I/O region) according to an embodiment of the present invention.
Figure 15:
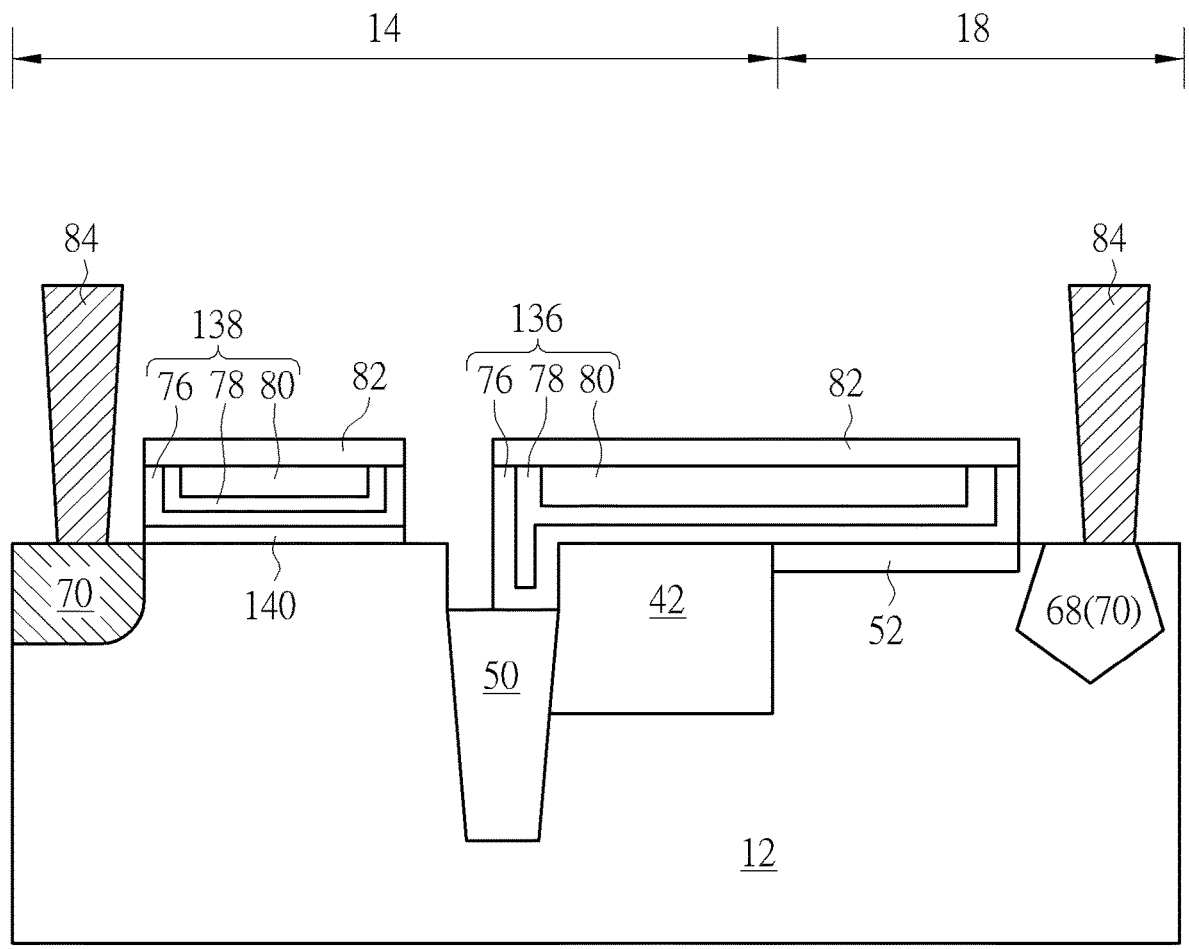
FIG. 15 illustrates a structural view of a boundary device on the boundary between HV region and LV region (or I/O region) according to an embodiment of the present invention.

Referring to FIGS. 12-15, FIGS. 12-15 illustrate structural views of forming boundary device on the boundary of HV region 14, MV region 16, and LV region 18 (or I/O region) according to different embodiments of the present invention, in which FIG. 12 illustrates a structural view of a boundary device on the boundary between MV region and LV region (or I/O region), FIG. 13 illustrates a structural view of a boundary device on the boundary between HV region and MV region, and FIGS. 14 and 15 illustrate boundary devices on the boundary between HV region and LV region (or I/O region) according to different embodiments of the present invention. For simplicity purpose, same elements used in FIGS. 12-15 from the aforementioned embodiments are labeled with same numberings.

It should be noted that embodiment shown in FIGS. 1-11 pertains to a semiconductor device fabricated under 14 nm technology node hence a non-planar or FinFET device is formed on the LV region 18. Nevertheless, since the boundary devices shown in FIGS. 12-15 pertain to semiconductor devices fabricated under 17 nm technology node, all of the boundary devices whether disposed on the boundary between the MV region 16 and LV region 18, on the boundary between the HV region 14 and the MV region 16, or on the boundary between the HV region 14 and the LV region 18 are planar field-effect transistors. In other words, no fin-shaped structures are formed in the substrate 12 on all of the HV region 14, the MV region 16, and the LV region 18.

First, as shown in FIG. 12, the boundary device between the MV region 16 and the LV region 18 (or I/O region) includes a gate dielectric layer 48 disposed on the MV region 16, a gate dielectric layer 52 disposed on the LV region 18, a gate structure 132 disposed on the gate dielectric layers 48 and 52 at the same time, a source/drain region 70 adjacent to one side of the gate structure 132 in the substrate 12 of the MV region 16, an epitaxial layer 68 including the source/drain region 70 adjacent to one side of the gate structure 132 in the substrate 12 of the LV region 18, and contact plugs 84 connecting to the source/drain region 70 and the epitaxial layer 68 respectively, in which the sidewalls of the gate dielectric layers 48, 52 could be aligned with the boundary between the MV region 16 and the LV region 18.

It should be noted that the source/drain regions 70 adjacent to two sides of the gate structure 132 are asymmetrical structures. For instance, the source/drain region 70 on left side of the gate structure 132 on the MV region 16 is formed by directly implanting ions into the substrate 12 through an ion implantation process while the source/drain region 70 on right side of the gate structure 132 on the LV region 18 could be formed by implanting ions directly into the epitaxial layer 68 or could be formed by the epitaxial layer 68 itself directly without additional doping processes. In other words, no epitaxial layer is formed in the substrate 12 adjacent to left side of the gate structure 132 while an epitaxial layer 68 is formed in the substrate 12 adjacent to right side of the gate structure 132. Preferably, the gate structure 132 and the source/drain regions 70 adjacent to two sides of the gate structure 132 together constitute the same MOS transistor, in which the source/drain regions 70 preferably have different heights. For instance, the top surface of the source/drain region 70 on left side of the gate structure 132 is slightly lower than the top surface of the source/drain region 70 on right side of the gate structure 132. For simplicity purpose, standard transistor elements such as spacers and lightly doped drains (LDDs) are omitted in the boundary devices shown in this embodiment and embodiments afterwards.

Moreover, the two gate dielectric layers 48, 52 directly under the gate structure 132 preferably have different thicknesses. For instance, the thickness of the gate dielectric layer 52 on the LV region 18 is preferably less than the thickness of the gate dielectric layer 48 on the MV region 16. It should be noted that even though the top surface of the gate dielectric layer 48 directly under the gate structure 132 is even with the top surface of the gate dielectric layer 52 while the bottom surface of the gate dielectric layer 52 is higher than the bottom surface of the gate dielectric layer 48, according to other embodiment of the present invention, the two gate dielectric layers 48, 52 directly under the gate structure 132 could also have different thicknesses while the top surfaces of the two layers 48, 52 are not even with each other. For instance, it would be desirable to still have the thickness of the gate dielectric layer 52 less than the thickness of the gate dielectric layer 48 and the bottom surface of the gate dielectric layer 52 is higher than the bottom surface of the gate dielectric layer 48 but the top surface of the gate dielectric layer 52 could be slightly lower than or higher than the top surface of the gate dielectric layer 48, which are all within the scope of the present invention.

It should further be noted that the two gate dielectric layer 48, 52 directly under the gate structure 132 are formed under different stage of the fabrication process. For instance, according to the aforementioned process shown in FIGS. 1-11, it would be desirable to first form the gate dielectric layer 48 on the MV region 16 and then form the gate dielectric layer 52 on the LV region 18 thereafter and since the gate dielectric layer 48, 52 are formed one after another, the boundary between the two layers 48, 52 could form a distinctive step profile or right angle.

As shown in FIG. 13, the boundary device between the HV region 14 and MV region 16 includes a STI 50 in the substrate 12 of the HV region 14, a gate dielectric layer 42 disposed adjacent to the STI 50 on the HV region 14, a gate dielectric layer 48 disposed on the MV region 16, a gate structure 134 disposed on the STI 50 and the gate dielectric layers 42 and 48 at the same time, a source/drain region 70 adjacent to one side of the STI 50 or the gate structure 134 in the substrate 12 of the HV region 14, another source/drain region 70 adjacent to one side of the gate structure 134 in the substrate 12 of the MV region 16, and contact plugs 84 connecting the source/drain regions 70, in which the sidewalls of the gate dielectric layers 42, 48 could be aligned with the boundary between the HV region 14 and the MV region 16.

In contrast to the embodiment shown in FIG. 12 includes no epitaxial layer in the substrate 12 adjacent to one side of the gate structure 132 and an epitaxial layer in the substrate 12 adjacent to another side of the of the gate structure 132, the source/drain regions 70 adjacent to two sides of the gate structure 134 in this embodiment are both formed by implanting ions directly into the substrate 12 through ion implantation process. In other words, no epitaxial layers are formed in the substrate 12 adjacent to two sides of the gate structure 134 on both HV region 14 and MV region 16. Preferably, the gate structure 134 and the source/drain regions 70 adjacent to two sides of the gate structure 134 together constitute the same MOS transistor, in which the source/drain regions 70 preferably have different heights. For instance, the top surface of the source/drain region 70 on left side of the gate structure 134 is slightly higher than the top surface of the source/drain region 70 on right side of the gate structure 134.

Similar to the aforementioned embodiment, the two gate dielectric layers 42, 48 directly under the gate structure 134 preferably have different thicknesses. For instance, the thickness of the gate dielectric layer 48 on the MV region 16 is preferably less than the thickness of the gate dielectric layer 42 on the HV region 14. Moreover, even though the top surface of the gate dielectric layer 42 directly under the gate structure 134 is even with the top surface of the gate dielectric layer 48 while the bottom surface of the gate dielectric layer 48 is higher than the bottom surface of the gate dielectric layer 42, according to other embodiment of the present invention, the two gate dielectric layers 42, 48 directly under the gate structure 134 could also have different thicknesses while the top surfaces of the two layers 42, 48 are not even with each other. For instance, it would be desirable to still have the thickness of the gate dielectric layer 48 less than the thickness of the gate dielectric layer 42 and the bottom surface of the gate dielectric layer 48 higher than the bottom surface of the gate dielectric layer 42 while the top surface of the gate dielectric layer 48 could be slightly lower than or higher than the top surface of the gate dielectric layer 42, which are all within the scope of the present invention.

It should further be noted that the two gate dielectric layer 42, 48 directly under the gate structure 134 are formed under different stage of the fabrication process. For instance, according to the aforementioned process shown in FIGS. 1-11, it would be desirable to first form the gate dielectric layer 42 on the HV region 14 and then form the gate dielectric layer 48 on the MV region 16 thereafter and since the gate dielectric layer 42, 48 are formed one after another, the boundary between the two layers 42, 48 could form a distinctive step profile or right angle.

As shown in FIG. 14, the boundary device between the HV region 14 and LV region 18 includes a STI 50 in the substrate 12 of the HV region 14, a gate dielectric layer 42 disposed adjacent to the STI 50 on the HV region 14, a gate dielectric layer 52 disposed on the LV region 18, a gate structure 136 disposed on the STI 50 and the gate dielectric layers 42 and 52 at the same time, a source/drain region 70 adjacent to one side of the STI 50 or the gate structure 136 in the substrate 12 of the HV region 14, an epitaxial layer 68 including a source/drain region 70 adjacent to one side of the gate structure 136 in the substrate 12 of the LV region 18, and contact plugs 84 connecting the source/drain region 70 and the epitaxial layer 68, in which the sidewalls of the gate dielectric layers 42, 52 could be aligned with the boundary between the HV region 14 and the LV region 18.

Similar to the embodiment shown in FIG. 12, the source/drain regions 70 adjacent to two sides of the gate structure 136 are asymmetrical structures. For instance, the source/drain region 70 on left side of the gate structure 136 on the HV region 14 is formed by directly implanting ions into the substrate 12 through an ion implantation process while the source/drain region 70 on right side of the gate structure 136 on the LV region 18 could be formed by implanting ions directly into the epitaxial layer 68 or could be formed by the epitaxial layer 68 directly without additional doping processes. In other words, no epitaxial layer is formed in the substrate 12 adjacent to left side of the gate structure 136 while an epitaxial layer 68 is formed in the substrate 12 adjacent to right side of the gate structure 136. Preferably, the gate structure 136 and the source/drain regions 70 adjacent to two sides of the gate structure 136 together constitute the same MOS transistor, in which the source/drain regions 70 could have same or different heights. For instance, the top surface of the source/drain region 70 on left side of the gate structure 136 is substantially even with the top surface of the source/drain region 70 on right side of the gate structure 136.

Similar to the aforementioned embodiments, the two gate dielectric layers 42, 52 directly under the gate structure 136 preferably have different thicknesses. For instance, the thickness of the gate dielectric layer 52 on the LV region 18 is preferably less than the thickness of the gate dielectric layer 42 on the HV region 14. Moreover, even though the top surface of the gate dielectric layer 42 directly under the gate structure 136 is even with the top surface of the gate dielectric layer 52 while the bottom surface of the gate dielectric layer 52 is higher than the bottom surface of the gate dielectric layer 42, according to other embodiment of the present invention, the two gate dielectric layers 42, 52 directly under the gate structure 136 could also have different thicknesses while the top surfaces of the two layers 42, 52 are not even with each other. For instance, it would be desirable to still have the thickness of the gate dielectric layer 52 less than the thickness of the gate dielectric layer 42 and the bottom surface of the gate dielectric layer 52 higher than the bottom surface of the gate dielectric layer 42 while the top surface of the gate dielectric layer 52 could be slightly lower than or higher than the top surface of the gate dielectric layer 42, which are all within the scope of the present invention.

It should further be noted that the two gate dielectric layer 42, 52 directly under the gate structure 136 are formed under different stage of the fabrication process. For instance, according to the aforementioned process shown in FIGS. 1-11, it would be desirable to first form the gate dielectric layer 42 on the HV region 14 and then form the gate dielectric layer 52 on the LV region 18 thereafter and since the gate dielectric layer 42, 52 are formed one after another, the boundary between the two layers 42, 52 could form a distinctive step profile or right angle.

As shown in FIG. 15, the boundary device between the HV region 14 and LV region 18 includes a STI 50 in the substrate 12 of the HV region 14, a gate dielectric layer 42 disposed adjacent to the STI 50 on the HV region 14, a gate dielectric layer 52 disposed on the LV region 18, a gate structure 136 disposed on the STI 50 and the gate dielectric layers 42 and 52 at the same time, another gate structure 138 disposed adjacent to another side of the STI 50 on the substrate 12 of the HV region 14, a source/drain region 70 adjacent to one side of the gate structure 138 in the substrate 12 of the HV region 14, an epitaxial layer 68 including a source/drain region 70 adjacent to one side of the gate structure 136 in the substrate 12 of the LV region 18, and contact plugs 84 connecting the source/drain region 70 and the epitaxial layer 68, in which the sidewalls of the gate dielectric layers 42, 52 could be aligned with the boundary between the HV region 14 and the LV region 18.

In contrast to the boundary device shown in FIG. 14 only includes a single gate structure 136, the boundary device of this embodiment not only includes a gate structure 136 on top of the gate dielectric layers 42 and 52, but also includes another gate structure 138 disposed on the substrate 12 adjacent to another side of the STI 50, in which the width of the gate structure 138 is slightly less than the width of the gate structure 136, both gate structures 136, 138 preferably includes same compositions such as both gate structures 136, 138 are made of metal gates, and a sidewall such as the right sidewall of the gate structure 138 could be aligned with or not aligned with the sidewall of the substrate 12 on left side of the STI 50.

It should be noted that the gate dielectric layer 140 directly under the gate structure 138 and the two gate dielectric layers 42, 52 could be formed in the same process or different processes. If the gate dielectric layer 140 and the gate dielectric layer 42 were fabricated in the same process, the top surface of the gate dielectric layer 140 is preferably even with the top surface of the gate dielectric layer 42. If the gate dielectric layer 140 and the gate dielectric layer 52 were fabricated in the same process, the top surface of the gate dielectric layer 140 is preferably even with the top surface of the gate dielectric layer 52. In this embodiment, the gate dielectric layer 140 is formed after the formation of the gate dielectric layers 42, 52 so that the top surface of the gate dielectric layer 140 is slightly higher than the top surface of the two gate dielectric layers 42, 52.

Similar to the embodiment shown in FIG. 12, the source/drain regions 70 adjacent to two sides of the gate structure 136 are asymmetrical structures. For instance, the source/drain region 70 on left side of the gate structure 138 on the HV region 14 is formed by directly implanting ions into the substrate 12 through an ion implantation process while the source/drain region 70 on right side of the gate structure 136 on the LV region 18 could be formed by implanting ions directly into the epitaxial layer 68 or could be formed by the epitaxial layer 68 directly without additional doping processes. In other words, no epitaxial layer is formed in the substrate 12 adjacent to left side of the gate structure 138 while an epitaxial layer 68 is formed in the substrate 12 adjacent to right side of the gate structure 136.

Moreover, similar to the aforementioned embodiments, the two gate dielectric layers 42, 52 directly under the gate structure 136 preferably have different thicknesses. For instance, the thickness of the gate dielectric layer 52 on the LV region 18 is preferably less than the thickness of the gate dielectric layer 42 on the HV region 14. Moreover, even though the top surface of the gate dielectric layer 42 directly under the gate structure 136 is even with the top surface of the gate dielectric layer 52 while the bottom surface of the gate dielectric layer 52 is higher than the bottom surface of the gate dielectric layer 42, according to other embodiment of the present invention, the two gate dielectric layers 42, 52 directly under the gate structure 136 could also have different thicknesses while the top surfaces of the two layers 42, 52 are not even with each other. For instance, it would be desirable to still have the thickness of the gate dielectric layer 52 less than the thickness of the gate dielectric layer 42 and the bottom surface of the gate dielectric layer 52 higher than the bottom surface of the gate dielectric layer 42 while the top surface of the gate dielectric layer 52 could be slightly lower than or higher than the top surface of the gate dielectric layer 42, which are all within the scope of the present invention.

It should further be noted that the two gate dielectric layer 42, 52 directly under the gate structure 136 are formed under different stage of the fabrication process. For instance, according to the aforementioned process shown in FIGS. 1-11, it would be desirable to first form the gate dielectric layer 42 on the HV region 14 and then form the gate dielectric layer 52 on the LV region 18 afterwards and since the gate dielectric layer 42, 52 are formed one after another, the boundary between the two layers 42, 52 could form a distinctive step profile or right angle.

Preferably, the thickness of the gate dielectric layer 42 on the HV region 14 from the aforementioned embodiments is preferably between 500 Angstroms to 900 Angstroms and most preferably at 700 Angstroms, the thickness of the gate dielectric layer 48 on the MV region 16 is preferably between 100 Angstroms to 300 Angstroms and most preferably at 200 Angstroms, the thickness of the gate dielectric layer 52 on the LV region 18 is preferably between 5 Angstroms to 35 Angstroms and most preferably at 20 Angstroms, and the thickness of the gate dielectric layer on the I/O region (not shown) is preferably between 10 Angstroms to 50 Angstroms and most preferably at 30 Angstroms.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising: providing a substrate having a first region and a second region having different voltage levels; forming a first gate dielectric layer on the first region wherein a sidewall of the first gate dielectric layer is aligned with a boundary between the first region and the second region; forming a second gate dielectric layer on the second region wherein a sidewall of the second gate dielectric layer is aligned with a boundary between the first region and the second region, and forming a first gate structure extending from the first region to the second region and directly on the first gate dielectric layer and the second gate dielectric layer while the first gate dielectric layer and the second gate dielectric layer comprise different thicknesses and contact each other directly, wherein the first gate structure overlaps a boundary between the first region and the second region, and wherein a first sidewall of the first gate structure is coplanar with a sidewall of the first gate dielectric layer in the first region, and wherein a second sidewall of the first gate structure is coplanar with a sidewall of the second gate dielectric layer in the second region.

2. The method of claim 1, further comprising:
   forming a source/drain region adjacent to the first gate dielectric layer; and
   forming an epitaxial layer adjacent to the second gate dielectric layer.

3. The method of claim 1, further comprising:
   forming a shallow trench isolation (STI) in the substrate;
   forming the first gate dielectric layer adjacent to the STI;
   forming the first gate structure on the STI, the first gate dielectric layer, and the second gate dielectric layer; and
   forming a second gate structure adjacent to the STI.

4. The method of claim 1, wherein top surfaces of the first gate dielectric layer and the second gate dielectric layer are coplanar.

5. The method of claim 1, wherein the first region comprises a high-voltage (HV) region and the second region comprises a medium-voltage (MV) region.

6. The method of claim 1, wherein the first region comprises a high-voltage (HV) region and the second region comprises a low-voltage (LV) region.

7. The method of claim 1, wherein the first region comprises a medium-voltage (MV) region and the second region comprises a low-voltage (LV) region.

8. A semiconductor device, comprising: a substrate having a first region and a second region having different voltage levels; a first gate dielectric layer on the first region wherein a sidewall of the first gate dielectric layer is aligned with a boundary between the first region and the second region; a second gate dielectric layer on the second region wherein a sidewall of the second gate dielectric layer is aligned with a boundary between the first region and the second region; and a first gate structure extending from the first region to the second region and directly on the first gate dielectric layer and the second gate dielectric layer while the first gate dielectric layer and the second gate dielectric layer comprise different thicknesses and contact each other directly, wherein the first gate structure overlaps a boundary between the first region and the second region, and wherein a first sidewall of the first gate structure is coplanar with a sidewall of the first gate dielectric layer in the first region, and wherein a second sidewall of the first gate structure is coplanar with a sidewall of the second gate dielectric layer in the second region.

9. The semiconductor device of claim 8, further comprising:
   a source/drain region adjacent to the first gate dielectric layer; and
   an epitaxial layer adjacent to the second gate dielectric layer.

10. The semiconductor device of claim 8, further comprising:
    a shallow trench isolation (STI) in the substrate;
    the first gate dielectric layer adjacent to the STI;
    the first gate structure on the STI, the first gate dielectric layer, and the second gate dielectric layer; and
    a second gate structure adjacent to the STI.

11. The semiconductor device of claim 8, wherein top surfaces of the first gate dielectric layer and the second gate dielectric layer are coplanar.

12. The semiconductor device of claim 8, wherein the first region comprises a high-voltage (HV) region and the second region comprises a medium-voltage (MV) region.

13. The semiconductor device of claim 8, wherein the first region comprises a high-voltage (HV) region and the second region comprises a low-voltage (LV) region.

14. The semiconductor device of claim 8, wherein the first region comprises a medium-voltage (MV) region and the second region comprises a low-voltage (LV) region.

* * * * *